(12) United States Patent
Liu

(10) Patent No.: US 10,709,008 B2
(45) Date of Patent: Jul. 7, 2020

(54) POWER MODULE ASSEMBLY STRUCTURE

(71) Applicant: OTO TECHNOLOGY CORP., Taichung (TW)

(72) Inventor: Tung-Jung Liu, Taichung (TW)

(73) Assignee: OTO TECHNOLOGY CORP., Taichung (TW)

( * ) Notice: Subject to any disclaimer, the term of this patent is extended or adjusted under 35 U.S.C. 154(b) by 0 days.

(21) Appl. No.: 16/297,719

(22) Filed: Mar. 11, 2019

(65) Prior Publication Data

US 2019/0289709 A1 Sep. 19, 2019

(30) Foreign Application Priority Data

Mar. 14, 2018 (TW) ................................ 107108635

(51) Int. Cl.
| | |
|---|---|
| *H05K 1/00* | (2006.01) |
| *H05K 1/02* | (2006.01) |
| *H05K 1/11* | (2006.01) |
| *H05K 1/18* | (2006.01) |

(52) U.S. Cl.
CPC ......... *H05K 1/0207* (2013.01); *H05K 1/0209* (2013.01); *H05K 1/113* (2013.01); *H05K 1/118* (2013.01); *H05K 1/181* (2013.01); *H05K 2201/0919* (2013.01)

(58) Field of Classification Search
USPC .......................................................... 361/749
See application file for complete search history.

(56) References Cited

U.S. PATENT DOCUMENTS

| | | | |
|---|---|---|---|
| 2006/0138640 A1* | 6/2006 | Beroz ............... | H01L 23/49833 257/700 |
| 2014/0273349 A1* | 9/2014 | Lim ................... | H01L 23/4334 438/108 |
| 2015/0145111 A1 | 5/2015 | Mengel et al. | |

* cited by examiner

*Primary Examiner* — Andargie M Aychillhum
(74) *Attorney, Agent, or Firm* — Li & Cai Intellectual Property Office

(57) ABSTRACT

A power module assembly structure includes an element layer, a flexible printed circuit board layer, and an external wire layer. The element layer includes one component. The flexible printed circuit board layer includes at least one insulating region and at least one conductive region. The external wire layer is disposed on a second side of the flexible printed circuit board layer. The first side and the second side of the flexible printed circuit board layer are two opposite sides, and the external wire layer includes at least one external wire. The at least one external wire is electrically connected to the at least one conductive region of the flexible printed circuit board layer. The heat generated by the one component is directly conducted to the outside of the power module package structure through the at least one conductive region and the at least one external wire.

8 Claims, 3 Drawing Sheets

POWER MODULE ASSEMBLY STRUCTURE

CROSS-REFERENCE TO RELATED PATENT APPLICATION

This application claims the benefit of priority to Taiwan Patent Application No. 107108635, filed on Mar. 14, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power module assembly structure, and more particularly to a power module assembly structure with high heat dissipation efficiency.

BACKGROUND OF THE DISCLOSURE

Conventional power module assembly structures use a ceramic substrate as a circuit trace substrate. Various components of the power module are disposed on the ceramic substrate, and external wires are soldered at the edge of the ceramic substrate to electrically connect to an outside circuit. The components on the ceramic substrate will generate a great amount of heat due to energization. In the conventional power module assembly structure, the heat of the component is mainly transmitted to the ceramic substrate, and the heat sink is disposed under the ceramic substrate for heat dissipation. Due to the small traces on the ceramic substrate, the heat cannot be quickly conducted through the small traces and the external wires.

In addition, since the structure of the conventional power module is provided with a heat sink under the ceramic substrate, a thermal grease is required to be disposed therebetween. Even if the thermal conductivity of the ceramic substrate and the heat sink are relatively high, the thermal grease usually has lower thermal conductivity. In this way, the heat generated by the components is transmitted to the ceramic substrate through the thermal grease, and is conducted to the heat sink, causing very large heat resistance of the heat flow path, so that the heat dissipation efficiency cannot be improved. In addition, the conventional power module is required to include a heat sink, so that the cost cannot be effectively reduced.

Therefore, it is an important issue in the industry to provide a power module assembly structure with high heat dissipation efficiency and low cost.

SUMMARY OF THE DISCLOSURE

In response to the above-referenced technical inadequacies, the present disclosure provides a power module assembly structure.

In one aspect, the present disclosure provides a power module assembly structure. The power module assembly structure includes an element layer, a flexible printed circuit board layer, and an external wire layer. The element layer includes a plurality of components. The element layer is disposed on a first side of the flexible printed circuit board layer, and the components are electrically connected to a first side of each of the plurality of conductive regions of the flexible printed circuit board layer. The flexible printed circuit board layer is disposed on the external wire layer. The external wire layer includes at least one external wire, and the at least one external wire is electrically connected to second sides of the conductive regions. The heat generated by the plurality of components is directly conducted to an outside of the power component device through the plurality of conductive regions and the at least one external wire for heat dissipation.

In one aspect, the present disclosure provides a power module assembly structure including an element layer, a flexible printed circuit board layer, and an external wire layer. The element layer includes a plurality of components. The element layer is disposed on a first side of the flexible printed circuit board layer, and the components are electrically connected to a first side of each of the plurality of conductive regions of the flexible printed circuit board layer. The flexible printed circuit board layer is disposed on the external wire layer, the external wire layer is at least one external wire, and the at least one external wire is electrically connected to second sides of the conductive regions. The heat generated by the plurality of components is directly conducted to an outside of the power component device through the plurality of conductive regions and the at least one external wire for heat dissipation.

Therefore, due to the change of the structure of the power module assembly structure of the present disclosure, the heat generated by the components is conducted through the metal of low thermal conductivity, and the heat dissipation efficiency can be effectively improved. In addition, since the heat conduction path and the conductive path of the components are the same in the present disclosure, when the power module is designed, the heat dissipation design of the power module assembly structure can be regulated by the reinforcement or reduction of the conductive path.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
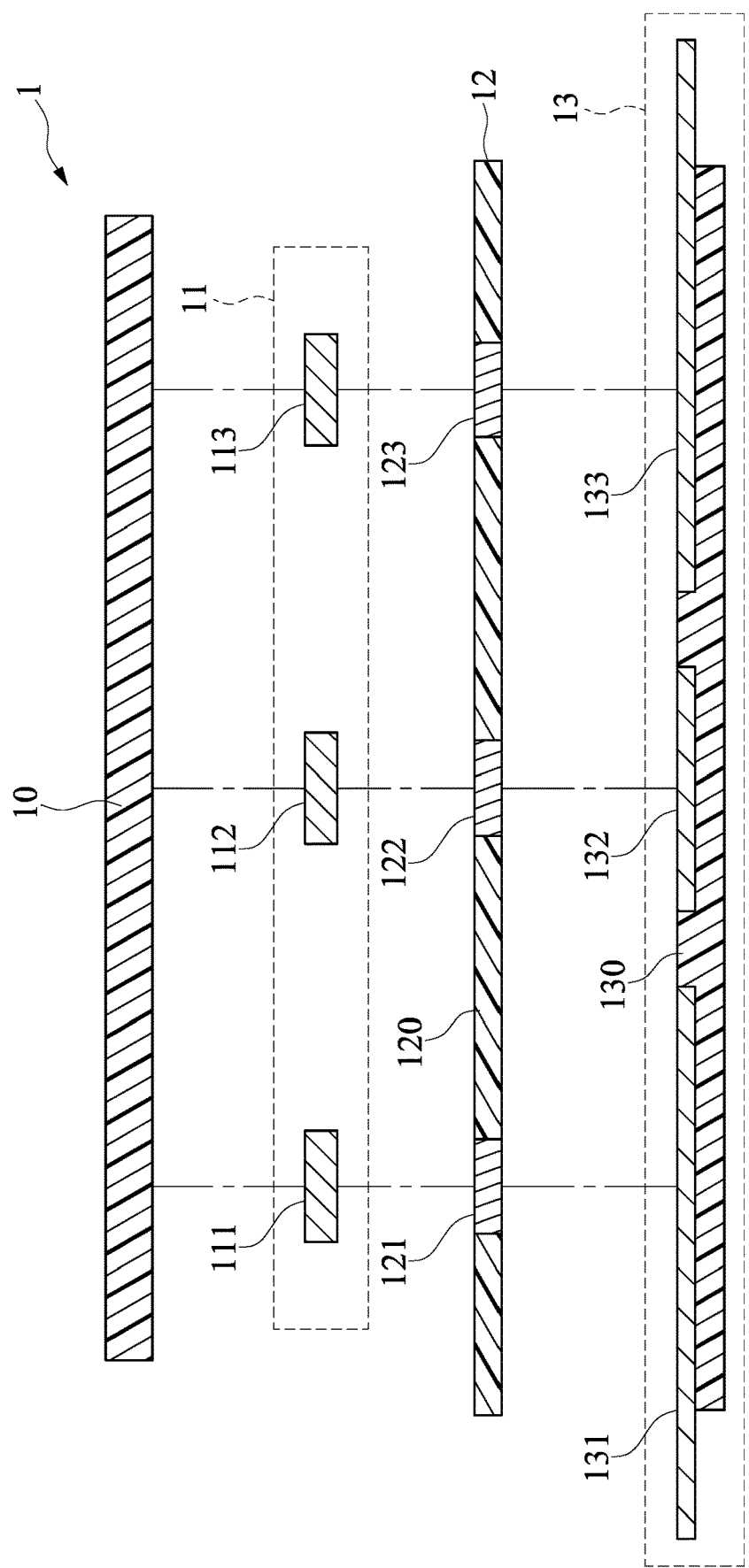
FIG. 1 is a schematic cross-sectional view showing a power module assembly structure according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
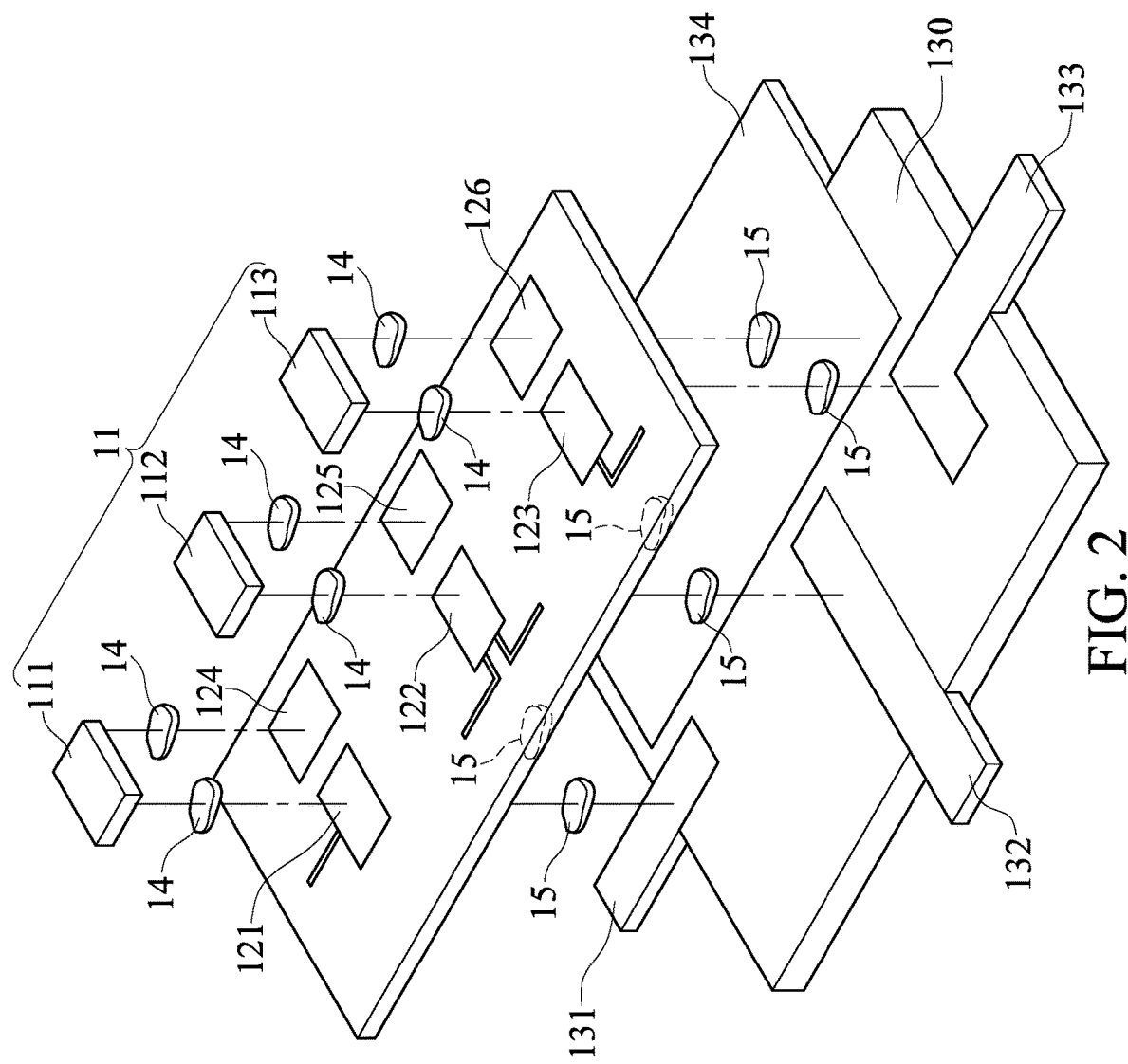
FIG. 2 is an exploded perspective view showing an assembly structure of a power module according to an embodiment of the present disclosure.

Referring to FIG. 1 and FIG. 2, FIG. 1 is a schematic cross-sectional view showing a power module assembly structure according to an embodiment of the present disclosure and FIG. 2 is an exploded perspective view showing an assembly structure of a power module according to an embodiment of the present disclosure.

In the embodiment of the present disclosure, a power module assembly structure 1 is a module or a device for providing a DC voltage or an AC voltage through various power components or power switching components. In the embodiment, the power module assembly structure 1 is not limited to a particular type of power unit or a power switching unit, which is not limited in the present disclosure.

The power module assembly structure 1 includes an element layer 11, a flexible printed circuit board (flexible PCB) layer 12, and an external wire layer 13. The element layer 11 is disposed on a first side of the flexible printed circuit board layer 12, and the external wire layer 13 is disposed on a second side of the flexible PCB layer 12. The first side and the second side of the flexible PCB layer 12 are opposite sides of the flexible PCB layer 12. In other words, the element layer 11 and the external wire layer 13 are respectively disposed on both sides of the flexible PCB layer 12. In the embodiment, the element layer 11 includes a plurality of power units and other control units, passive elements, which form a control circuit through a conductive layer (for example, copper foil) of the flexible PCB layer 12.

In the embodiment, the element layer 11 includes a first component 111, a second component 112, and a third component 113. In other words, the element layer 11 includes at least one element. In addition, the number of components included in the element layer 11 can be adjusted according to actual requirements, which is not limited in the present disclosure.

In the embodiment, each of the power components on the element layer 11 is a heat source. When the power module is powered, each component enters a working mode, and the heat generated by each component is transmitted to the flexible PCB layer 12.

In the embodiment, the flexible PCB layer 12 is a flexible circuit board including an insulating region 120, a first conductive region 121, a second conductive region 122, and a third conductive region 123. The first conductive region 121, the second conductive region 122, and the third conductive region 123 of the flexible layer 12 are correspondingly disposed according to the arrangement of the first element 111, the second element 112, and the third element 113 of the element layer 11. In other words, the first component 111 is electrically connected to the first conductive region 121, the second component 112 is electrically connected to the second conductive region 122, and the third component 113 is electrically connected to the third conductive region 123. In the embodiment, the flexible PCB layer 12 is a flexible circuit board with a double-sided window, and a conductive layer is disposed in the flexible PCB layer 12 to electrically connect other circuits.

Furthermore, the first component 111, the second component 112, and the third component 113 respectively include a plurality of terminals (not shown). One of the terminals (not shown) of the first component 111 is electrically connected to the first conductive region 121. One of the terminals (not shown) of the second component 112 is electrically connected to the second conductive region 122. One of the terminals (not shown) of the third component 113 is electrically connected to the third conductive region 123.

In the embodiment, the flexible PCB layer 12 further includes a fourth conductive region 124, a fifth conductive region 125, and a sixth conductive region 126. One of the terminals (not shown) of the first component 111 is electrically connected to the fourth conductive region 124. One of the terminals (not shown) of the second component 112 is electrically connected to the fifth conductive region 125. One of the terminals (not shown) of the third component 113 is electrically connected to the sixth conductive region 126.

In the embodiment, the number of conductive regions of the flexible PCB layer 12 can be adjusted according to actual requirements, which is not limited in the present disclosure. Furthermore, the number of conductive regions of the flexible PCB layer 12 can be adjusted according to the heat generated by the first component 111, the second component 112, and the third component 113 of the element layer 11. In other words, the user can arrange the input terminal or the output terminal of the voltage and current based on the conductive region on the flexible PCB 12. In the embodiment, the first conductive region 121, the second conductive region 122, the third conductive region 123, the fourth conductive region 124, the fifth conductive region 125, and the sixth conductive region 126 are conductive regions with a double-sided window. In other words, a copper foil or other conductive material is laid in the flexible PCB layer 12, which is opened on both sides of the flexible PCB layer 12 as areas electrically connected to the element layer 11 and the external wire layer 13.

The external wire layer 13 includes a terminal layer substrate 130, a first external wire 131, a second external wire 132, and a third external wire 133. In the embodiment, the first external wire 131, the second external wire 132, and the third external wire 133 are all disposed in the terminal layer substrate 130. The first external wire 131, the second external wire 132, and the third external wire 133 are electrically connected to the second side of the first conductive region 121, the second side of the second conductive region 122, and the second side of the third conductive region 123.

In the embodiment, the external wire layer 13 further includes a fourth external wire 134. The fourth external wire 134 is electrically connected to the fourth conductive region 124, the fifth conductive region 125, and the sixth conductive region 126. In the actual terminal design, the fourth external wire 134 can be a power terminal or a ground terminal.

In the embodiment, the material of the terminal layer substrate 130 is a plastic. However, the user can adjust the design according to actual requirements, which is not limited in the present disclosure.

Furthermore, the heat generated by the first component 111 can be directly conducted to the outside of the power module assembly structure 1 through the first conductive region 121 and the first external wire 131. The heat generated by the second component 112 can be directly conducted to the outside of the power module assembly structure 1 through the second conductive region 122 and the second external wire 132. The heat generated by the third component 113 can be directly conducted to the outside of the power module assembly structure 1 through the third conductive region 123 and the third external wire 133. In addition, the heat generated by the first component 111, the second component 112, and the third component 113 can be directly conducted to the fourth conductive region 124, the fifth conductive region 125, the sixth conductive region 126, and the fourth external wire 134 to the exterior of the power module assembly structure 1.

In the embodiment, each of the first external wire 131, the second external wire 132, the third external wire 133, and the fourth external wire 134 is a flat metal plate. In other words, the thickness and width of the first external wire 131, the second external wire 132, the third external wire 133, and the fourth external wire 134 may be based on the magnitude of the voltage and current output or the magnitude of the input voltage and current, and the design and adjustment are not limited in the present disclosure. In other embodiments, the thickness of the first external wire 131, the second external wire 132, the third external wire 133, and the fourth external wire 134 is between 0.1 mm and 5 mm, which is adjusted based on the current, and is not limited in the present disclosure.

In the embodiment, the power module assembly structure 1 further includes an encapsulating layer 10 disposed on the upper side of the element layer 11 and the flexible PCB layer 12. In another embodiment, an adhesive potting can be used to package the power module assembly structure 1, which is not limited in the present disclosure.

Referring to FIG. 2, the power module assembly structure 1 in the embodiment further includes a first connecting material layer 14 and a second connecting material layer 15. One of the terminals of the first component 111, one of the terminals of the second component 112, and one of the terminals of the third component 113 are respectively connected to the first conductive region 121 and the second conductive region 122, and the third conductive region 123 through the first connecting material layer 14. In addition, one of the terminals of the first component 111, one of the terminals of the second component 112, and one of the terminals of the third component 113 are respectively connected to the fourth conductive region 124 and the fifth conductive region 125 and the sixth conductive region 126 through the first connecting material layer 14.

The first conductive region 121, the second conductive region 122, and the third conductive region 123 are electrically connected to the first external wire 131, the second external wire 132, and the third external wire 133 through a second connecting material layer 15, respectively. The fourth conductive region 124, the fifth conductive region 125, and the sixth conductive region 126 are electrically connected to the fourth external wire 134 through a second connecting material layer 15, respectively.

In the embodiment, the first connecting material layer 14 and the second connecting material layer 15 include a lead-free solder, a solder paste or a conductive silver paste, which can be adjusted according to actual requirements, and is not limited in the present disclosure.

Second Embodiment

Figure 3:
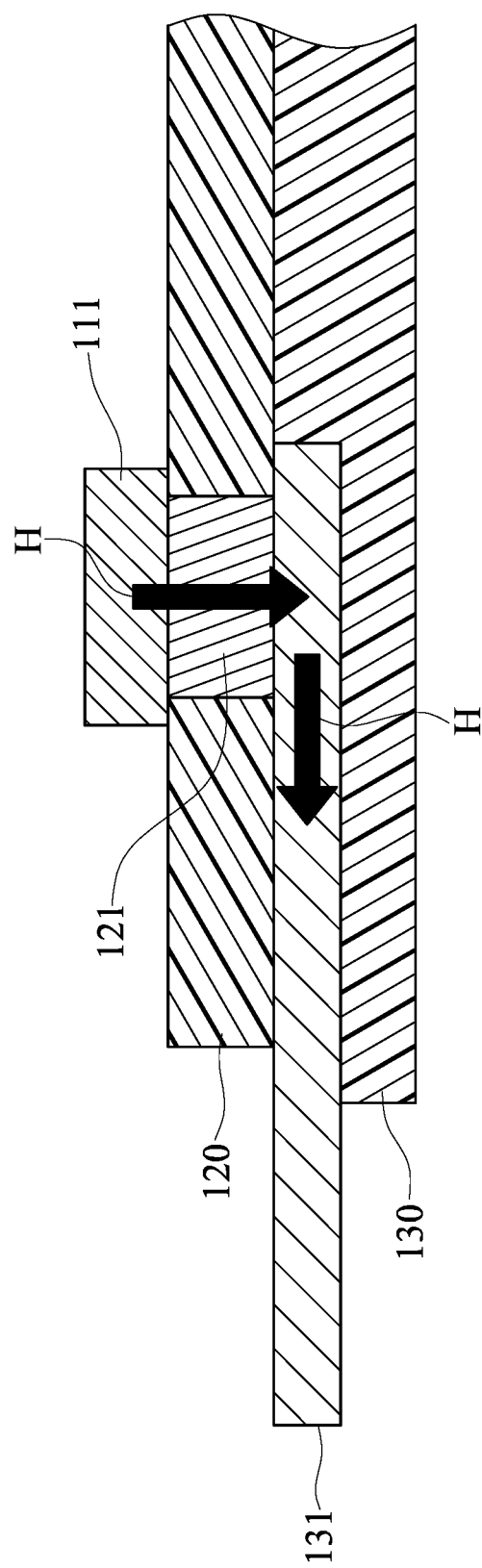
FIG. 3 is a partial schematic diagram of the power module assembly structure of FIG. 1.

Referring to FIG. 3, FIG. 3 is a partial schematic diagram of the power module assembly structure of FIG. 1.

In the power module assembly structure 1, a partially assembled structure is taken as a reference for the description of the heat conduction.

A heat conduction direction H of the heat generated by the first component 111 is directly transmitted to the first external wire 131 through the first connection material layer 14, the first conductive region 121, and the second connection material layer 15. In the embodiment, the first external wire 131 is a flat-shaped terminal, and the heat transmission efficiency is higher than that of the thin wire-shaped wire. Therefore, the heat can be efficiently conducted to the outside of the power module assembly structure 1.

Furthermore, in the embodiment, the heat conduction direction H of the heat generated by the first element 111 is conducted through the conductive path of the electric power. In other words, since one of the terminals of the first element 111 is electrically connected to the first side of the first conductive region 121 through the first connecting material layer 14, the second side of the first conductive region 121 is electrically connected to the first external wire 131 through the second connecting material layer 15. In the embodiment, the user selects the output current of the first component 111 or the component electrical terminal with a large input current as the arrangement of the conductive region. Therefore, the heat generated by the first component 111 caused by a large current can be efficiently conducted through the conductive path to the outside of the power module assembly structure. In the embodiment, the heat conduction manners of the other conductive regions and the external wires are also the same as those of the heat dissipation method described above, which are omitted herein.

In conclusion, due to the change of the structure of the power module assembly structure of the present disclosure, the heat generated by the components is conducted through the metal of low thermal conductivity, and the heat dissipation efficiency can be effectively improved. In addition, since the heat conduction path and the conductive path of the components are the same in the present disclosure, when the power module is designed, the heat dissipation design of the power module assembly structure can be regulated by the reinforcement or reduction of the conductive path. Furthermore, since the ceramic substrate is not used in the power module assembly structure of the present disclosure, and the assembly structure is changed, the cost is reduced, accordingly.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power module assembly structure comprising:
an element layer including at least one component, the at least one component including a plurality of terminals;
a flexible printed circuit board layer including at least one insulating region and at least one conductive region, wherein the at least one conductive region is disposed corresponding to the at least one component, and one of the terminals of the at least one component is electrically connected to the at least one conductive region, the element layer is disposed on a first side of the flexible layer; and
an external wire layer disposed on a second side of the flexible printed circuit board layer, the first side and the second side of the flexible printed circuit board layer being two opposite sides, and the external wire layer including at least one external wire, the at least one external wire being electrically connected to the at least one conductive region of the flexible printed circuit board layer, the flexible printed circuit board layer being disposed between the element layer and the external wire layer, the at least one conductive region is a double-sided window conductive region of the flexible printed circuit board layer opened on both sides as areas electrically connected to the element layer and the external wire layer;
wherein the heat generated by the at least one component is directly conducted to the outside of the power module package structure through the at least one conductive region and the at least one external wire.

2. The power module assembly structure of claim 1, wherein the external wire layer includes a terminal layer substrate, and the at least one external wire is disposed in the terminal layer substrate corresponding to the at least one conductive region.

3. The power module assembly structure of claim 1, wherein the at least one terminal of the at least one component is electrically connected to the at least one conductive region through a first connecting material layer, the at least one conductive region and the at least one external wire of the external wire layer are electrically connected by a second connecting material layer.

4. The power module assembly structure of claim 3, wherein the first connecting material layer and the second connecting material layer are a lead-free solder, a solder paste or a conductive silver paste.

5. A power module assembly structure comprising:
an element layer, the element layer including a plurality of components;
a flexible printed circuit board layer, the element layer being disposed on a first side of the flexible printed circuit board layer, and the components being electrically connected to a first side of each of the plurality of conductive regions of the flexible printed circuit board layer; and
an external wire layer, the flexible printed circuit board layer being disposed on the external wire layer, the external wire layer including at least one external wire, and the at least one external wire being electrically connected to second sides of the conductive regions, the flexible printed circuit board layer being disposed between the element layer and the external wire layer, the at least one conductive region is a double-sided window conductive region of the flexible printed circuit board layer opened on both sides as areas electrically connected to the element layer and the external wire layer;
wherein the heat generated by the plurality of components is directly conducted to an outside of the power component device through the plurality of conductive regions and the at least one external wire for heat dissipation.

6. The power module assembly structure of claim 5, wherein the external wire layer includes a terminal layer substrate, and the at least one external wire is disposed in the terminal layer substrate corresponding to the at least one conductive region.

7. The power module assembly structure of claim 5, wherein the at least one component and the at least one conductive region are electrically connected by a first connecting material layer, the at least one conductive region and at least one external wire of the external wire layer are electrically connected through a second layer of connecting material.

8. The power module assembly structure of claim 5, wherein the first connecting material layer and the second connecting material layer include a lead-free solder, a solder paste or a conductive silver paste.

* * * * *